United States Patent
O et al.

(10) Patent No.: US 7,408,754 B1
(45) Date of Patent: Aug. 5, 2008

(54) FAST TRIGGER ESD DEVICE FOR PROTECTION OF INTEGRATED CIRCUITS

(75) Inventors: Hugh Sung-Ki O, Fremont, CA (US); Chih-Ching Shih, Pleasanton, CA (US); Yow-Juang Bill Liu, San Jose, CA (US); Cheng-Hsiung Huang, Cupertino, CA (US); Wei-Guang Wu, Los Angeles, CA (US); Billy Jow-Tai Kwong, San Francisco, CA (US); Yu-Cheng Richard Gao, San Jose, CA (US)

(73) Assignee: Altera Corporation, San Jose, CA (US)

( * ) Notice: Subject to any disclaimer, the term of this patent is extended or adjusted under 35 U.S.C. 154(b) by 234 days.

(21) Appl. No.: 10/992,591

(22) Filed: Nov. 18, 2004

(51) Int. Cl.
*H02H 3/20* (2006.01)
(52) U.S. Cl. ..................... 361/91.1
(58) Field of Classification Search ............ 361/91.1
See application file for complete search history.

(56) References Cited

U.S. PATENT DOCUMENTS

| | | | |
|---|---|---|---|
| 4,627,082 A * | 12/1986 | Pelgrom et al. | 377/63 |
| 4,774,420 A | 9/1988 | Sutton | |
| 5,072,273 A | 12/1991 | Avery | |
| 5,274,262 A | 12/1993 | Avery | |
| 5,343,053 A | 8/1994 | Avery | |
| 5,591,992 A | 1/1997 | Leach | |
| 5,602,404 A | 2/1997 | Chen et al. | |
| 5,675,469 A * | 10/1997 | Racino et al. | 361/212 |
| 5,825,600 A | 10/1998 | Watt | |
| 5,872,379 A | 2/1999 | Lee | |
| 6,031,405 A * | 2/2000 | Yu | 327/313 |
| 6,172,403 B1 * | 1/2001 | Chen | 257/355 |
| 6,418,040 B1 * | 7/2002 | Meng | 363/60 |
| 6,768,616 B2 | 7/2004 | Mergens et al. | |
| 6,770,918 B2 | 8/2004 | Russ et al. | |
| 6,777,721 B1 | 8/2004 | Huang et al. | |
| 6,791,122 B2 | 9/2004 | Avery et al. | |
| 6,794,715 B1 | 9/2004 | Liu et al. | |
| 6,803,633 B2 | 10/2004 | Mergens et al. | |
| 6,850,397 B2 | 2/2005 | Russ et al. | |

(Continued)

OTHER PUBLICATIONS

A. Amerasekera & C. Duvvury, *ESD in Silicon Integrated Circuits*, pp. 98-101, 150-171, 215-219, 239-249 (Wiley, 2d ed. 2002).

*Primary Examiner*—Michael J Sherry
*Assistant Examiner*—Scott Bauer
(74) *Attorney, Agent, or Firm*—Morgan, Lewis & Bockius LLP

(57) ABSTRACT

The present invention provides an ESD device for protecting thin oxide layers in transistors or capacitors in an integrated circuit. In one embodiment, the ESD device includes a silicon-controlled rectifier (SCR), the SCR including a PNP bipolar transistor and a NPN bipolar transistor. The ESD device further includes first and second trigger devices coupled to the SCR and configured to simultaneously turn on the PNP bipolar transistor and the NPN bipolar transistor in response to an ESD pulse on the ESD device. The base of the NPN bipolar transistor is floating to allow a first external resistor to be connected between the base and emitter of the NPN bipolar transistor. A second external resistor can be connected between the base and emitter of the PNP bipolar transistor.

20 Claims, 9 Drawing Sheets

U.S. PATENT DOCUMENTS

2002/0122280 A1* 9/2002 Ker et al. .................... 361/56
2002/0153571 A1* 10/2002 Mergens et al. ............ 257/358
2004/0141269 A1* 7/2004 Kitagawa .................... 361/56
2004/0164354 A1* 8/2004 Mergens et al. ............ 257/355

* cited by examiner

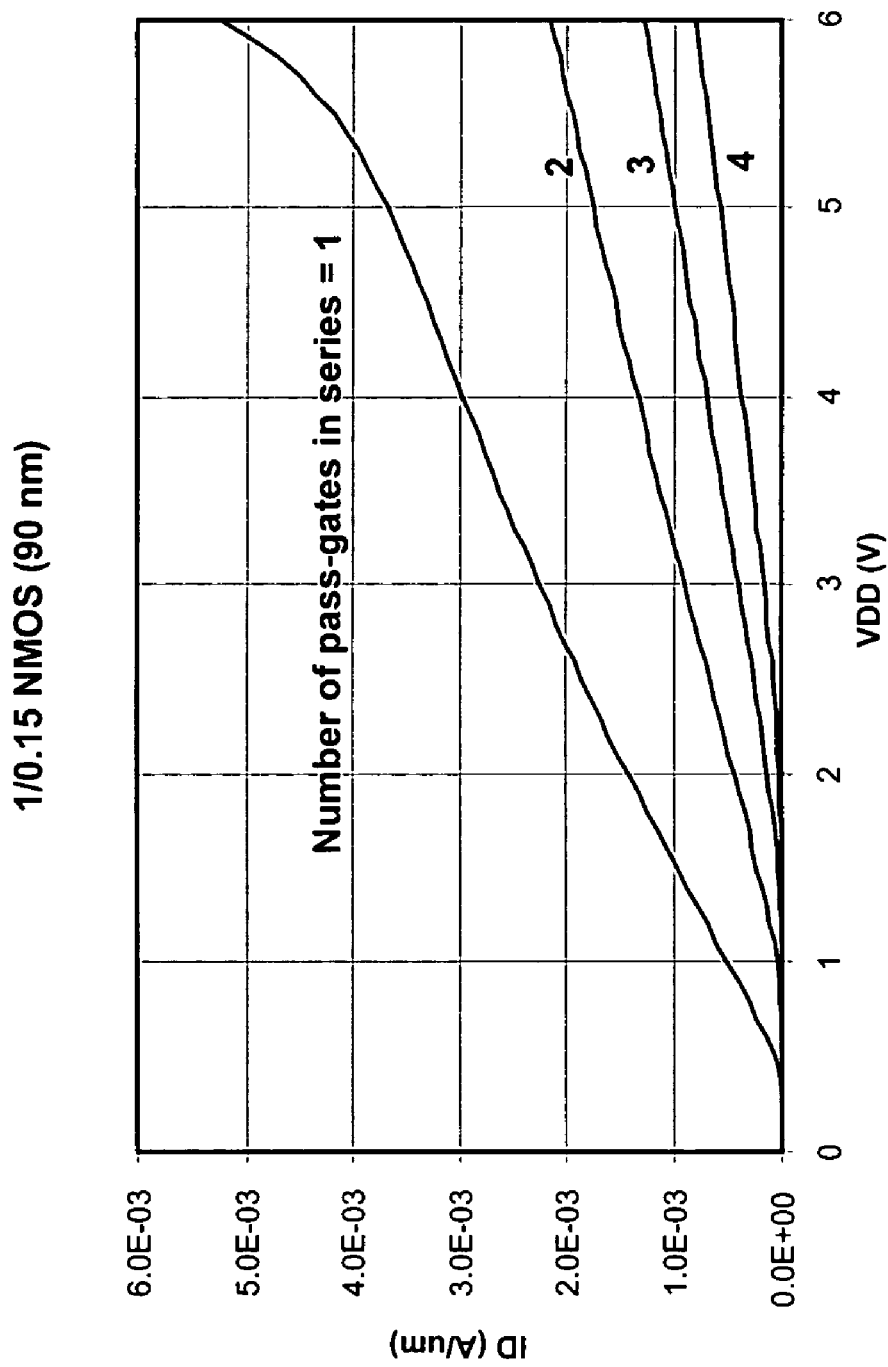
Figure 4 I-V plot of NMOS pass-gate devices

FAST TRIGGER ESD DEVICE FOR PROTECTION OF INTEGRATED CIRCUITS

BACKGROUND

The present invention relates to electronic devices, and more specifically to electrostatic discharge (ESD) protection of integrated circuits.

Metal-oxide-semiconductor (MOS) devices, such as MOS transistors and MOS capacitors are important components in integrated circuits. Many MOS devices include thin gate dielectrics that are susceptible to ESD induced damage. As the thickness of gate dielectrics scales down in more advanced technologies, the gate dielectrics, such as gate oxide, can rupture at lower voltages. Therefore, protecting gate dielectrics from ESD damage is critical.

It is well known that ESD, especially the Charge-Device Model (CDM) type of ESD, can damage the gate oxide of a MOS device. Although ESD devices can be used to protect the gate oxide, oxide rupture can still occur if the ESD devices have higher trigger voltages than the oxide breakdown voltage. Even when the trigger voltages of the ESD devices are lower than the oxide breakdown voltage, there is still no guarantee that the oxide can survive fast ESD events such as the CDM type of ESD events if the ESD devices are not triggered fast enough to shunt the ESD energy away from the MOS device.

SUMMARY OF THE INVENTION

The present invention provides an ESD device for protecting thin oxide layers in transistors or capacitors in an integrated circuit. In one embodiment of the present invention, the ESD device is coupled between a power bus and a ground bus in the integrated circuit and thus allows direct clamping between the power and ground buses during an ESD event to protect the thin oxide layers in the integrated circuit.

In one embodiment of the present invention, the ESD device includes a silicon-controlled rectifier (SCR) coupled between the power bus and the ground bus, the SCR including a PNP bipolar transistor and a NPN bipolar transistor. The ESD device further includes first and second trigger devices coupled to the SCR and configured to simultaneously turn on the PNP bipolar transistor and the NPN bipolar transistor in response to an ESD pulse on the ESD device. The base of the NPN bipolar transistor is floating to allow a first external resistor to be connected between the base of the NPN bipolar transistor and the ground bus. A second external resistor can be connected between the base and emitter of the PNP bipolar transistor.

The ESD device further includes a Zener diode coupled between the SCR and the power bus for increasing a holding voltage of the ESD device and a diode coupled between the power bus and the ground bus for discharging a negative ESD pulse on a power pin connected to the power bus.

In one embodiment of the present invention, the base of the NPN bipolar transistor is a floating P-well formed in a semiconductor substrate. The floating P-well may be isolated from the substrate using a deep N-well. Each of the first and second trigger devices includes at least one NMOS pass-gate transistor. Each NMOS pass gate device is also formed in a floating P-well formed in the semiconductor substrate. The floating P-well for the pass-gate device(s) may also be isolated from the semiconductor substrate by a deep N-well.

The simultaneous turning on of the PNP and NPN bipolar transistors allows the SCR to be turned on rapidly in an ESD event. The trigger and holding voltages of the ESD device can also be very low (<2.5V). Thus, the ESD device can be used for any core circuits such as PLL or level shifter circuits to protect thin oxide layers from ESD damage. The trigger voltage of the ESD device can also be adjusted by changing the device width of the NMOS pass-gate transistors in the trigger devices or by increasing the resistance values of the external resistors.

BRIEF DESCRIPTION OF THE DRAWINGS

FIG. 4 are plots of current-voltage characteristics of NMOS pass-gate devices in the trigger device.

DETAILED DESCRIPTION OF THE INVENTION

Figure 1:
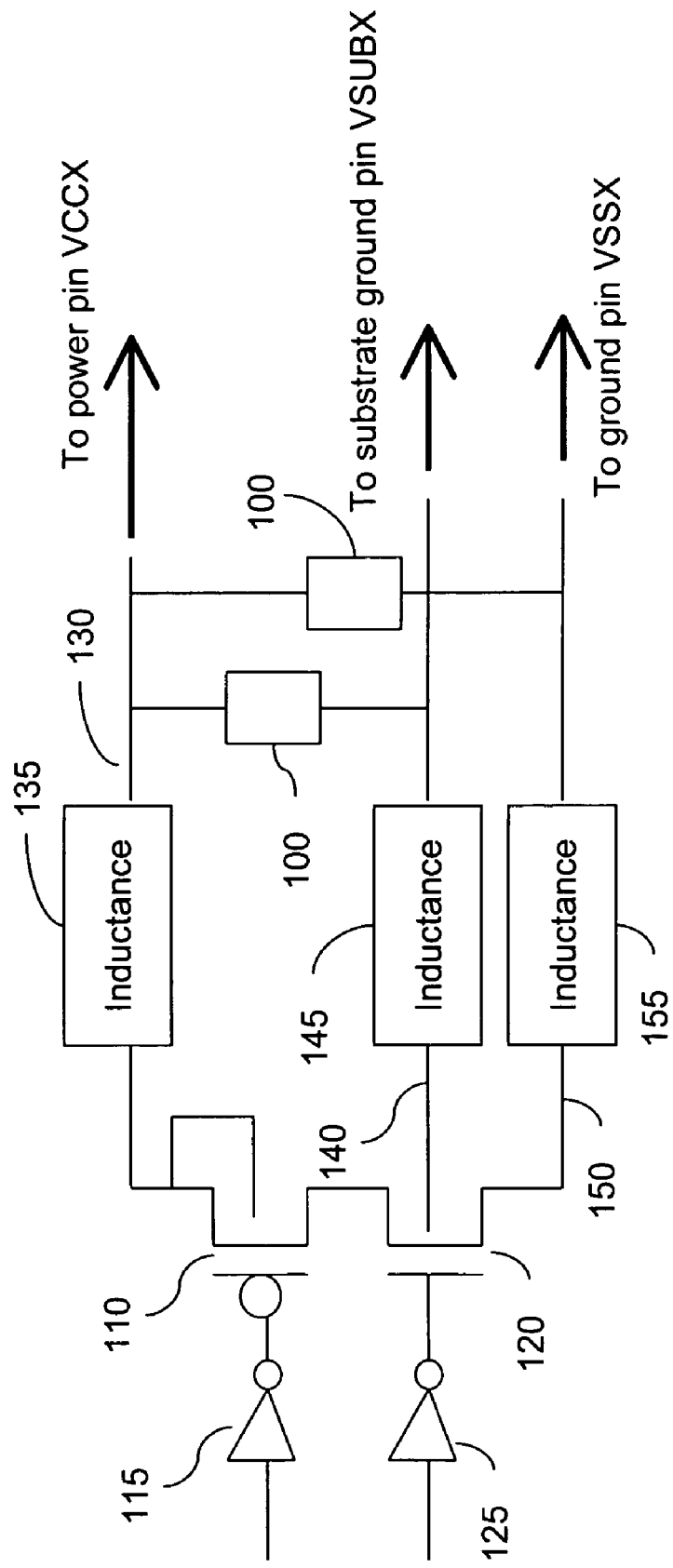
FIG. 1 is a circuit diagram illustrating a pair of CMOS transistors and parasitic inductance in the interconnect lines connecting the CMOS transistors to external pins of an integrated circuit.

The present invention provides a fast trigger ESD device with a low trigger voltage. To illustrate the need for such an ESD device, FIG. 1 depicts a pair of complimentary MOS (CMOS) transistors, which include a P-type MOS (PMOS) transistor 110 and an N-type MOS (NMOS) transistor 120, in an integrated circuit. The gates of transistors 110 and 120 are connected to internal circuits (not shown) of the integrated circuit through inverters 115 and 125, respectively. The source and substrate of PMOS transistor 110 is connected to a power pin or bus VCCX via an interconnect line 130. The substrate of NMOS transistor 120 is connected to a substrate ground pin or bus VSUBX via an interconnect line 140. The source of NMOS transistor 120 is connected to a general ground pin or bus VSSX via an interconnect line 150. Interconnect lines 130, 140, and 150 usually contribute parasitic inductance 135, 145, and 155, respectively. Parasitic inductance 135, 145, and 155 may also include contributions from packaging materials.

When an ESD event, such as a CDM ESD event, occurs, the gates of transistors 110 and 120 can discharge rapidly to a local ground or power bus (not shown) through nearby drivers or pins (not shown) that are grounded. The discharge of sources, drains, and substrates of transistors 110 and 120 through interconnect lines 130, 140, and 150 are usually slower due to more ESD charge on the VCCX, VSUBX, and VSSX pins and the existence of the interconnect inductance 135, 145, and 155. Thus, the gate oxide of MOS transistor 110 or 120 may rupture in an ESD event because the transistor gate discharges at a faster rate than the source, the substrate, or the drain, resulting in a large voltage drop across the gate oxide for a certain time period.

Although MOS transistors are used in FIG. 1 to illustrate the problem, ESD oxide damage may also occur to MOS capacitors. The CDM ESD discharge to a local power or a local ground bus is the worst-case scenario for oxide breakdown. The situation can be made even worse when various power and ground buses are decoupled using diodes to combat noise coupling problems. For example, as shown in FIG.

2, power buses VCCX, VCC1, and VCC2 are decoupled using pairs of serially connected diodes, and ground buses VSSX, VSS1, and VSS2 are decoupled using pairs of serially connected diodes. As a result, if the VCC1 or VSS1 bus is grounded during a CDM ESD discharge, the diodes may contribute additional voltage drop across gate oxides in the circuits powered by VCCX/VSSX and VCC2/VSS2. This is true even if one diode is used in place of each pair of serially connected diodes shown in the figure.

Figure 2:
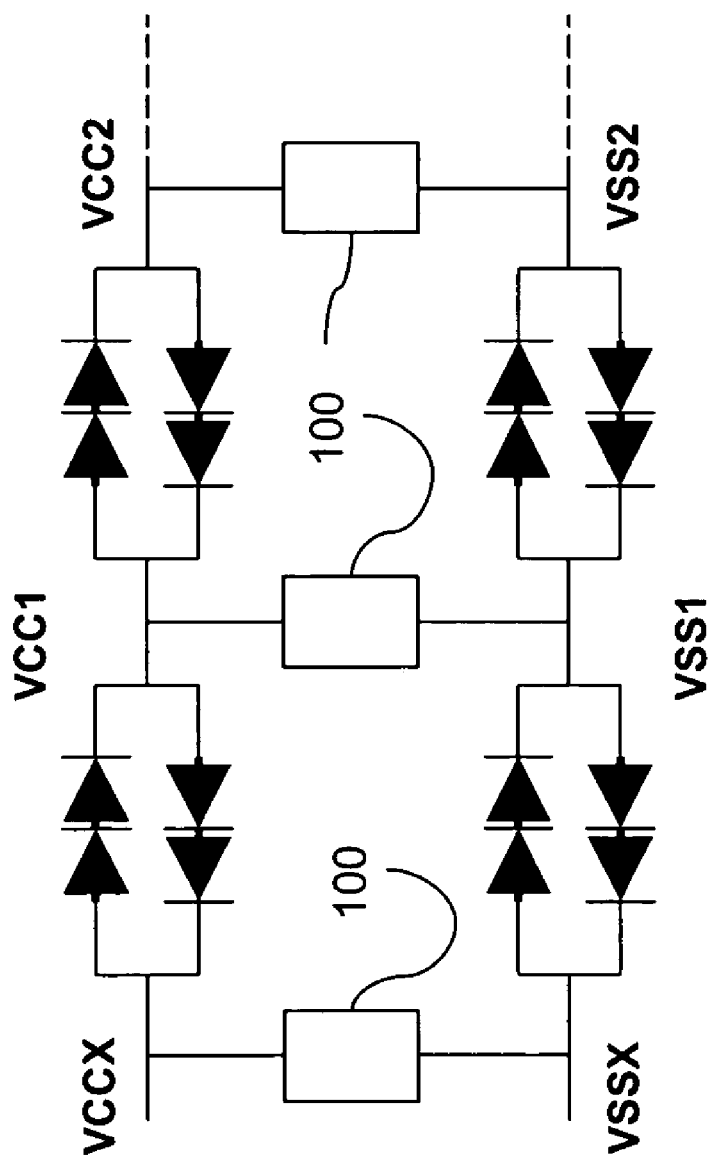
FIG. 2 is a circuit diagram illustrating effects of decoupling diodes on ESD damage of an integrated circuit.

It is not practical to use a local ESD device to clamp the gate to the source, the substrate, or the drain for each transistor in the integrated circuit. Even if this could be done, the clamping devices would add extra capacitance to each gate node and thus severely impact the circuit performance. To solve the problem demonstrated in FIGS. 1 and 2, fast trigger ESD protection devices 100 with a low trigger voltage are needed to provide direct clamping between power and ground buses, as shown in FIGS. 1 and 2.

Figure 3A:
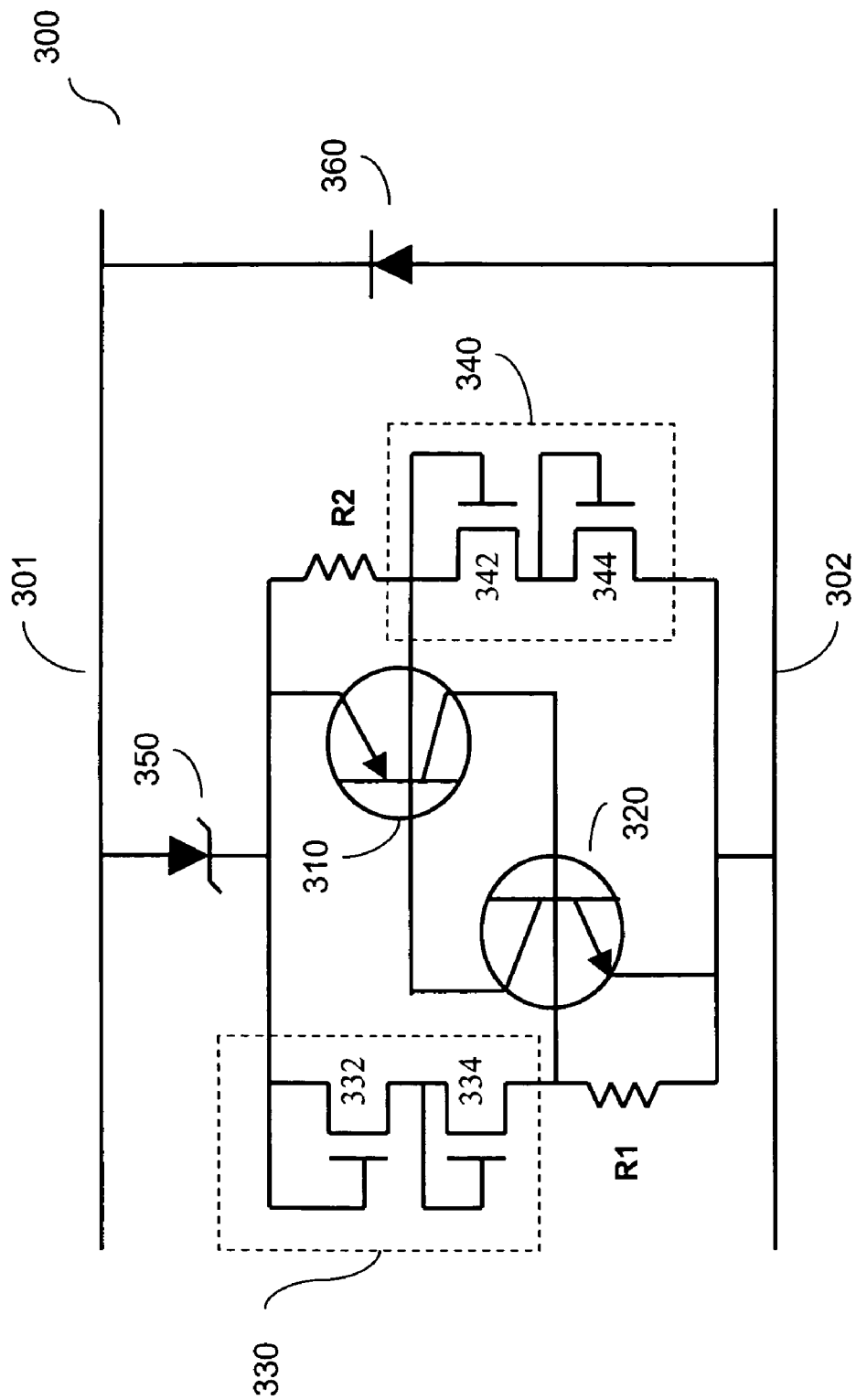
FIG. 3A is a circuit diagram of an ESD device according to one embodiment of the present invention.

FIG. 3A illustrates a fast trigger ESD device 300 according to one embodiment of the present invention. As shown in FIG. 3, ESD device 300 is connected between a power bus 301 and a ground bus 302 and includes two bipolar transistors, a PNP bipolar transistor 310 and a NPN bipolar transistor 320. The base of each bipolar transistor is connected to the collector of the other bipolar transistor to form a Silicon-Controlled Rectifier (SCR) structure. The emitter of the PNP bipolar transistor 310 is connected to the power bus 301 either directly or through a Zener diode 350. The emitter of the NPN bipolar transistor 320 is connected to the ground bus 302.

The Zener diode is provided to increase the holding voltage of the ESD device 100 so as to prevent latch-up during normal operation. One advantage of using Zener diodes instead of a conventional N+/P-well or P+/N-well diode for controlling the SCR holding voltage is that the voltage drop across the diode resistance is lower for the Zener diode because the bulk resistance of the Zener diode is lower than that of a conventional diode.

The ESD device 100 may further include a diode 360 for discharging negative ESD pulses from the power bus 301 to the ground bus 302. There is no additional mask required to make the diodes 350 and 360 as the implants constituting the diodes can be part of a standard manufacturing process.

The ESD device 100 further includes a trigger device 330 connected between the base of the NPN bipolar transistor 320 and the emitter of the PNP bipolar transistor 310, and a trigger device 340 connected between the base of the PNP bipolar transistor 310 and the emitter of the NPN bipolar transistor 320.

Figure 3B:
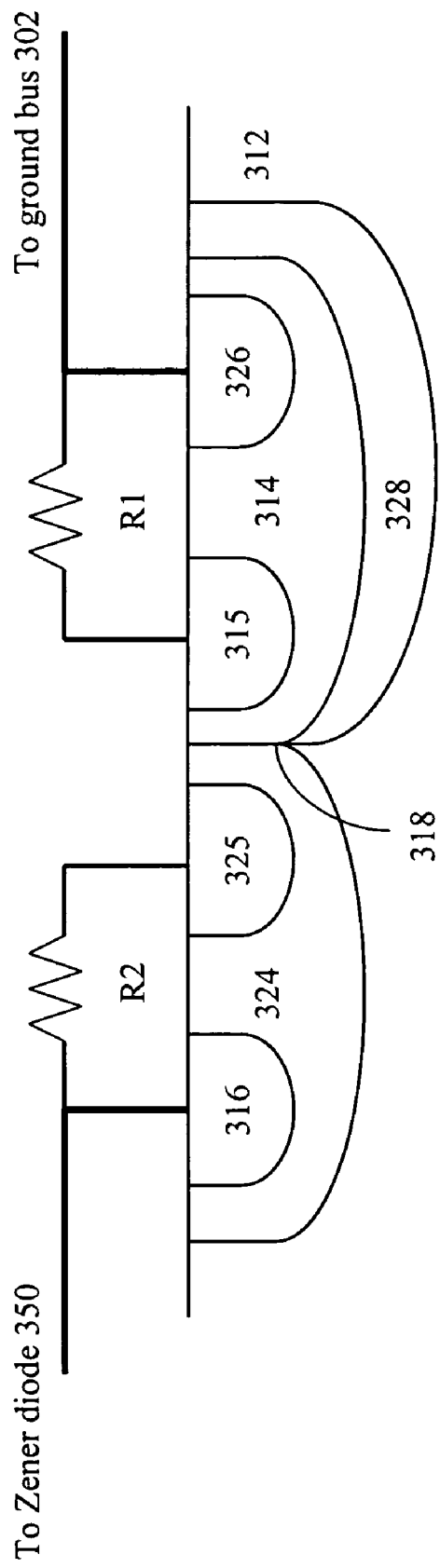
FIG. 3B is a cross-sectional view of an SCR structure in the ESD device on a semiconductor substrate.

FIG. 3B illustrates an example of the SCR structure in FIG. 3A on a silicon substrate 312. Those skilled in the art should realize that the SCR in FIG. 3A can be formed using a layout or geometry different from that shown in FIG. 3B without deviating from the spirit and scope of the present invention. In the embodiment of the present invention shown in FIG. 3B, a P-well tub 314 formed in the silicon substrate 312 is the collector of the PNP bipolar transistor 310, a N-well 324 formed adjacent to P-well tub 314 is the base of the PNP bipolar transistor 310, and a P+ or P++ diffusion 316 formed in N-well 324 or adjacent N-well 324 is the emitter of the PNP bipolar transistor 310. P-well tub 314 and N-well 324 also act as the base and collector of the NPN bipolar transistor 320, respectively, while an N+ or N++ diffusion 326 formed in P-well tub 314 or adjacent P-well tub 314 is the emitter of the NPN bipolar transistor 320. As will be apparent, the PNP transistor and the NPN transistor have a common PN junction 318. A P-well tap 315, which may be a P+ or P++ diffusion, is also formed in the P-well tub 314 to facilitate connecting the P-well tub to the external resistor R1. Likewise, a N-well tap 325, which may be a N+ or N++ diffusion, is formed in the N-well 324 to facilitate connecting the N-well to the external resistor R2.

In one embodiment of the present invention, P-well tub 314, which acts as the base of the NPN bipolar transistor 320 and the collector of the PNP bipolar transistor 310 is a floating P-well tub. It may additionally be isolated from the substrate using a deep N-well 328, which can be formed in the silicon substrate using conventional technologies. The floating P-well tub 314 allows the base of the NPN bipolar transistor 320 to be connected through a P+ tap 315 to a resistor R1 external to the SCR. Resistor R1, in turn, is connected to ground bus 302. The SCR is further configured to allow the base of the PNP bipolar transistor 310 to be connected through a N+ tap 325 to an external resistor R2. Resistor R2, in turn, is connected to Zener diode 350 and then to power bus 301. Thus, the trigger devices 330 and 340 are serially connected with resistors R1 and R2, respectively. Resistor R1 and R2 may be diffusion or poly resistors. In the case of diffusion resistors, the diffusion may be N+, N-well, P+, or isolated P-well. In the case of poly resistors, the poly is doped or undoped and, if doped, may be N-type or P-type. Advantageously, the resistors do not have silicide films on the silicon or polysilicon surfaces except in the contact areas.

When the power bus 301 is positive relative to the ground bus 302 during an ESD event, the trigger devices 330 and 340 conduct and trigger current flow through the external resistors R1 and R2, raising the base potential of the NPN bipolar transistor 320 and reducing the base potential of the PNP bipolar transistor 310. This simultaneously triggers the conduction of the NPN and the PNP bipolar transistors 310 and 320, enabling a fast turn on of the SCR to discharge the power bus 301 to the ground bus 302.

Figure 3C:
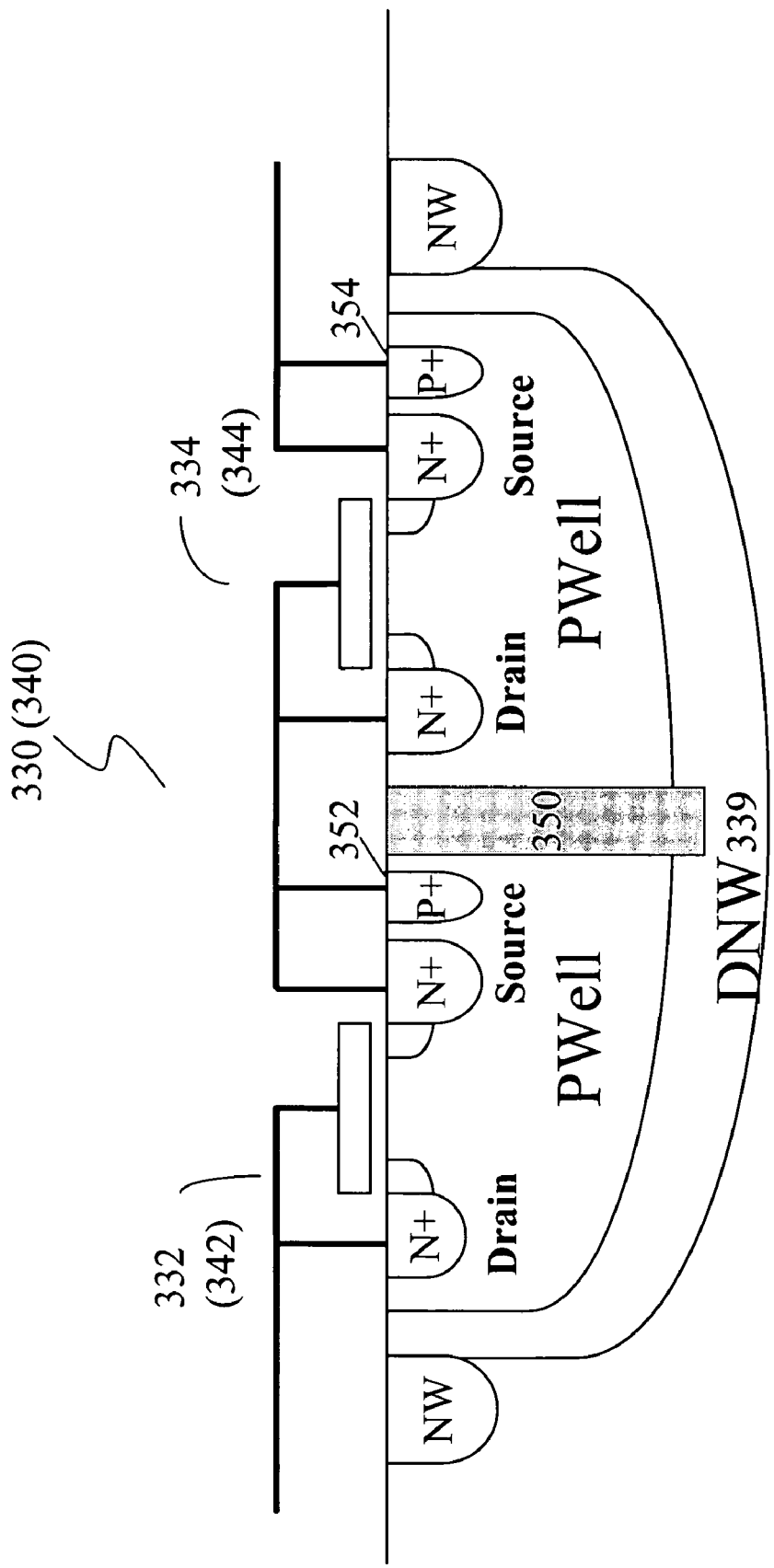
FIG. 3C is a cross-sectional view of a trigger device in the ESD device on the semiconductor substrate.

Various trigger devices may be used as trigger devices 330 and 340. In one embodiment of the present invention shown in FIG. 3A, trigger device 330 includes two serially connected NMOS pass-gate devices 332 and 334, and trigger device 340 includes two serially connected NMOS pass-gate devices 342 and 344. Each pair of NMOS pass-gate devices 332 and 334, or 342 and 344 is formed in an isolated P-well tub 337, which may be isolated from the silicon substrate using a deep N-well 339, as shown in FIG. 3C. The individual NMOS devices 332 and 334 or 342 and 344 are isolated from one another by a trench isolation 350. Each NMOS device comprises a source, a drain and a gate with the gate being connected to the drain. The NMOS devices in each pair are connected together by connecting the source of one device to the drain of the other. In addition, each P-well tub 337 is connected through a P+ region 352 or 354 to the source of the NMOS device formed in the tub. Although two pass-gate NMOS devices are used as trigger devices 330 and 340 in FIG. 3A, any number of serially connected pass-gate NMOS devices can be used as the trigger device.

The pass-gate devices provide fast triggering because they can be turned on rapidly. They are also not susceptible to ESD damage. The current required for the triggering can be supplied with relatively small voltage across the drain and the source of each pass gate device. Furthermore, since the substrate and the gate of each pass gate device are connected to the source and the drain, respectively, the voltage drop across the oxide is much smaller than the oxide breakdown voltage and thus does not cause oxide breakdown during ESD events.

FIG. 4 illustrates current-voltage characteristics of NMOS pass-gate devices having width/length of 1.0 µm/0.15 µm and gate oxide thickness of 1.8 nm. As shown in FIG. 4, a high trigger current can be supplied with a relatively low voltage.

For example, the current at 1.5V is 10 and 2.2 mA, respectively, for a one pass-gate NMOS device and for two serially connected NMOS pass-gate devices if the NMOS width is 10 μm. Although the examples in FIG. 4 use NMOS pass-gate devices having specific device width, length and gate oxide thickness, various device width, channel length and gate oxide thickness can be used. Lower trigger voltage for the SCR can be obtained by using a larger width for the NMOS pass-gate devices. Leakage currents from the trigger devices at operating voltage can be reduced by increasing the channel length of the NMOS pass-gate devices. Because the trigger devices are connected in series with the Zener diode, the leakage during normal operation is low.

In one embodiment of the present invention, external resistors R1 and R2 can have a resistance as low as 100 Ohms which is sufficient for supplying a 1.0V voltage drop typically required for turning on the NPN and the PNP bipolar transistors in the SCR. The trigger voltage in this case can be as low as 2.5V. The trigger voltage can be further reduced by increasing the value of the external resistors R1 and R2. Higher resistance values for the external resistors R1 and R2 also allow narrower NMOS pass-gate devices to be used for the triggering.

Figure 5:
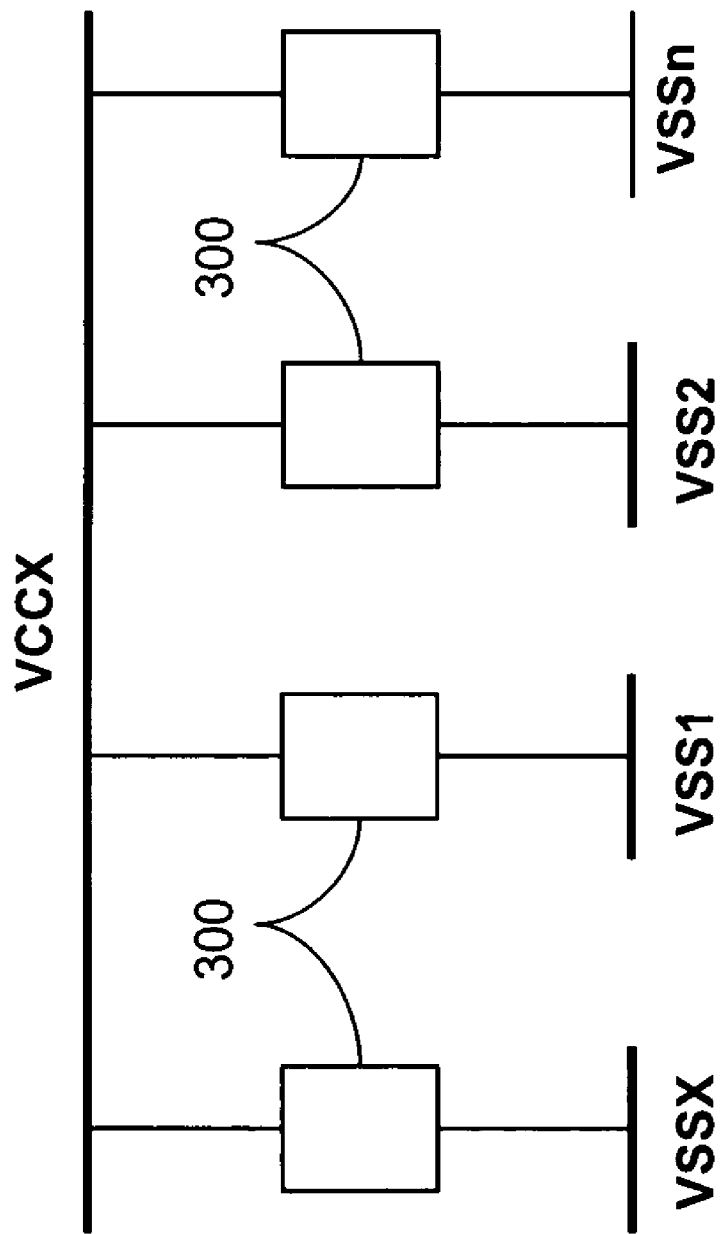
FIGS. 5-7 are circuit diagrams illustrating applications of the ESD protection device.
Figure 6:
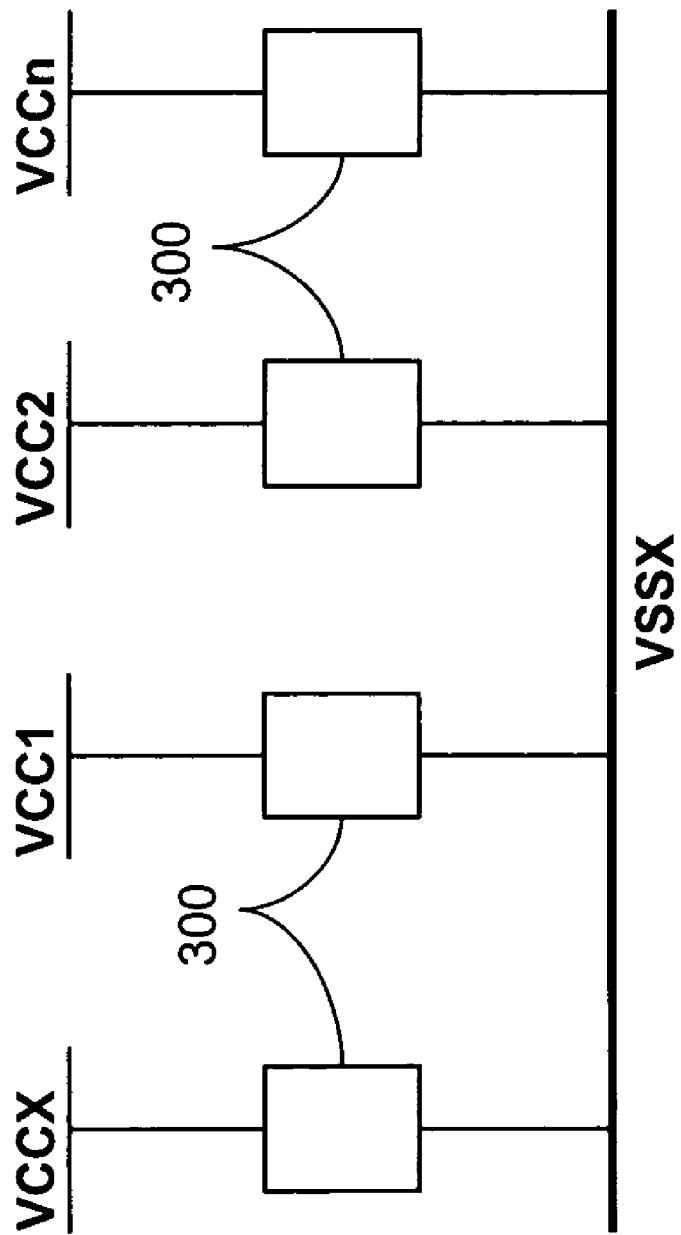
Figure 7:
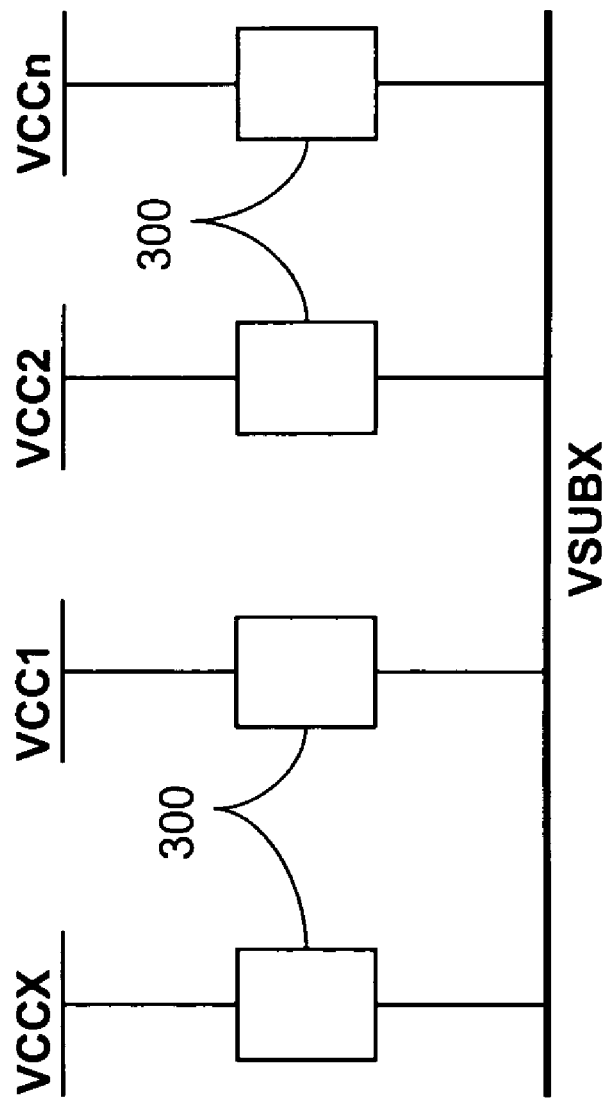

The fast trigger ESD device 300 can be used to provide direct clamping between various power and ground buses, as shown in FIGS. 5, 6, and 7. Any power bus can be clamped to different ground buses, and vice versa. This eliminates the need for decoupling diodes and thus reduces the power-supply clamp voltage required for protecting the gate oxide effectively. Because the PNP and NPN bipolar transistors in the SCR structure of the ESD device 300 are turned on simultaneously during an ESD event, the ESD device 300 provides faster discharge than conventional SCR types of ESD devices. The faster discharge through the SCR will counteract the slower discharge through interconnect inductance so that gate oxide layers can be protected. Furthermore, the ESD device 300 provides good protection to thin oxide layers in transistors and capacitors because of its low trigger voltage and low holding voltage (~2V). The trigger voltage is adjustable to suit different voltage applications.

As will be apparent to those skilled in the art, numerous variations of the embodiments described above may be implemented within the spirit and scope of the claims. As also will be recognized by those skilled in the art, while the interconnection of PNP bipolar transistor 310 and NPN bipolar transistor 320 shown in FIG. 3A is commonly called a silicon-controlled rectifier (SCR), transistors 310 and 320 may also be formed in other semiconductor materials instead of in silicon and the term silicon-controlled rectifier (SCR), as used herein is not limited to structures implemented in silicon but is intended to encompass the interconnection represented in FIG. 3A regardless of the material in which it is formed.

We claim:

1. An ESD device, comprising:
   a PNP bipolar transistor and a NPN bipolar transistor connected with each other to form a silicon-controlled rectifier (SCR);
   a first trigger device coupled between an emitter of the PNP bipolar transistor and a base of the NPN bipolar transistor, the first trigger device comprising at least one NMOS pass gate having a source and a drain formed in a first floating well in a semiconductor substrate with a gate coupled to the drain and the source coupled to the first floating well;
   a second trigger device coupled between a base of the PNP bipolar transistor and an emitter of the NPN bipolar transistor, the second trigger device comprising at least one NMOS pass gate having a source and a drain formed in a second floating well in the semiconductor substrate with a gate coupled to the drain and the source coupled to the second floating well;
   a first external resistor coupled between the base and emitter of the NPN bipolar transistor; and
   a second external resistor coupled between the base and emitter of the PNP bipolar transistor;
   wherein the base of the NPN bipolar transistor is a third floating well formed in the semiconductor substrate; and
   wherein said PNP bipolar transistor and said NPN bipolar transistor turn on simultaneously in response to an ESD pulse on the ESD device.

2. The ESD device of claim 1 wherein said SCR is coupled between a power bus and a ground bus.

3. The ESD device of claim 2 wherein said SCR is coupled to the power bus through a Zener diode.

4. The ESD device of claim 2 further comprising a diode coupled between the power bus and the ground bus for discharging a negative ESD pulse on the power bus.

5. The ESD device of claim 1 wherein the first floating well is isolated from the semiconductor substrate by a first deep N-well.

6. The ESD device of claim 1 wherein the third floating well is isolated from the semiconductor substrate by a second deep N-well.

7. A device for protecting thin oxide layers in transistors or capacitors coupled between a power bus and a ground bus in an integrated circuit, comprising:
   a silicon-controlled rectifier (SCR) coupled between the power bus and the ground bus, the SCR including a PNP bipolar transistor and a NPN bipolar transistor; and
   first and second trigger devices coupled to the SCR and configured to simultaneously turn on the PNP bipolar transistor and the NPN bipolar transistor in response to an electrostatic discharge (ESD) pulse on the device, the first trigger device comprising at least one NMOS pass gate having a source and a drain formed in a first floating well in a semiconductor substrate with a gate coupled to the drain and the source coupled to the first floating well and the second trigger device comprising at least one NMOS pass gate having a source and a drain formed in a second floating well in the semiconductor substrate with a gate coupled to the drain and the source coupled to the second floating well;
   a first external resistor coupled between the base and emitter of the NPN bipolar transistor; and
   a second external resistor coupled between the base and emitter of the PNP bipolar transistor;
   wherein a base of the NPN bipolar transistor is a third floating well formed in a semiconductor substrate that allows the first external resistor to be connected between the base of the NPN bipolar transistor and the ground bus.

8. The device of claim 7 wherein the SCR is configured to allow a second external resistor to be coupled between a base and an emitter of the PNP bipolar transistor.

9. The device of claim 8 wherein a trigger voltage of the device can be adjusted by changing the resistance values of the first and second external resistors.

10. The device of claim 7 wherein the first floating well in which the NMOS pass gate device is formed is isolated from the semiconductor substrate by a deep N-well.

11. The device of claim 7 wherein a trigger voltage of the device can be adjusted by changing a device width of the NMOS pass-gate transistor.

12. The device of claim 7 further comprising a Zener diode for increasing a holding voltage of the ESD device.

13. The device of claim 7 further comprising a diode coupled between the power bus and the ground bus for discharging a negative ESD pulse on a power pin connected to the power bus.

14. An apparatus for protecting a semiconductor device from excessive charge comprising:
   a PNP transistor and a NPN transistor formed in a semiconductor substrate, said transistors having a common PN junction
   a first trigger device coupled between an emitter of the PNP transistor and a base of the NPN bipolar transistor, the first trigger device comprising at least one NMOS pass gate having a source and a drain formed in a first floating well in the semiconductor substrate with a gate coupled to the drain and the source coupled to the first floating well;
   a second trigger device coupled between a base of the PNP transistor and an emitter of the NPN bipolar transistor, the second trigger device comprising at least one NMOS pass gate having a source and a drain formed in a second floating well in the semiconductor substrate with a gate coupled to the drain and the source coupled to the second floating well;
   a first external resistor coupled between the base and emitter of the NPN bipolar transistor; and
   a second external resistor coupled between the base and emitter of the PNP bipolar transistor;
   wherein the base of the NPN transistor is a third floating well formed in the semiconductor substrate; and
   wherein said PNP bipolar transistor and said NPN bipolar transistor turn on simultaneously in response to an ESD pulse on the semiconductor device.

15. The device of claim 14 wherein the first floating well is isolated from the semiconductor substrate by a first deep N-well.

16. The device of claim 14 wherein the third floating well is isolated from the semiconductor substrate by a second deep N-well.

17. An apparatus for protecting a semiconductor device from excessive charge comprising:
   a semiconductor substrate;
   a first well region formed in the substrate and having a first conductivity type;
   a second well region formed in the substrate adjacent to the first well region and having a second conductivity type opposite the first conductivity type with a PN junction being located between the first and second well regions;
   a first diffusion region of second conductivity type formed in said first well region;
   a second diffusion region of first conductivity type formed in said second well region;
   said first diffusion region, first well region and second well region forming a first bipolar transistor of a first type and said second diffusion region, second well region and first well region forming a second bipolar transistor of a second type;
   a first trigger device coupled between an emitter of the first bipolar transistor and a base of the second bipolar transistor, the first trigger device comprising at least one NMOS pass gate having a source and a drain formed in a first floating well in the semiconductor substrate with a gate coupled to the drain and the source coupled to the first floating well; and
   a second trigger device coupled between a base of the first bipolar transistor and an emitter of the second bipolar transistor, the second trigger device comprising at least one NMOS pass gate having a source and a drain formed in a second floating well in the semiconductor substrate with a gate coupled to the drain and the source coupled to the second floating well;
   a first external resistor coupled between the base and emitter of the NPN bipolar transistor; and
   a second external resistor coupled between the base and emitter of the PNP bipolar transistor;
   wherein the base of the first bipolar transistor is a third floating well formed in the semiconductor substrate; and
   wherein said first bipolar transistor and said second bipolar transistor turn on simultaneously in response to an electrostatic discharge (ESD) pulse on the semiconductor device.

18. The apparatus of claim 17 wherein the first floating well is isolated from the semiconductor substrate by a first deep N-well.

19. The apparatus of claim 17 wherein the third floating well is isolated from the semiconductor substrate by a second deep N-well.

20. A method of protecting a semiconductor device from excessive charge comprising:
   forming in a substrate a first deep well region having a first conductivity type;
   forming in the first deep well region a first well region having a second conductivity type such that the first well region is a floating well region isolated from the substrate by the deep well region;
   forming in the substrate a second well region adjacent the first well region, said second well region having a first conductivity type, and a PN junction being formed between said first and second well regions;
   forming a first diffusion region of first conductivity type in said first well region;
   forming a second diffusion region of second conductivity type in said second well region;
   said first diffusion region, first well region and second well region constituting a first bipolar transistor of a first type and said second diffusion region, second well region and first well region constituting a second bipolar transistor of a second type;
   forming in the substrate first and second trigger devices by
      for each trigger device, forming in the substrate a second deep well region having the first conductivity type;
      forming in the second deep well region a second well region having the second conductivity type such that the second well region is isolated from the substrate by the second deep well region;
      forming in the second well region a MOS transistor having a gate and first and second diffusion regions of the first conductivity type and a third diffusion region of the second conductivity type; and
      connecting the gate to the first diffusion region and connecting the second and third diffusion regions;
   connecting the first trigger device between the first diffusion region and the second well region of the first bipolar transistor;
   connecting the second trigger device between the second diffusion region and the first well region of the second bipolar transistor;
   connecting a first resistor between the first diffusion region and the first well region of the first bipolar transistor; and
   connecting a second resistor between the second diffusion region and the second well region of the second bipolar transistor.

\* \* \* \* \*